(12) United States Patent
Dubin et al.

(10) Patent No.: US 7,597,763 B2
(45) Date of Patent: Oct. 6, 2009

(54) ELECTROLESS PLATING SYSTEMS AND METHODS

(75) Inventors: Valery M. Dubin, Portland, OR (US); Arnel Fajardo, Beaverton, OR (US); Chin-Chang Cheng, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 956 days.

(21) Appl. No.: 10/763,470

(22) Filed: Jan. 22, 2004

(65) Prior Publication Data
US 2005/0163916 A1    Jul. 28, 2005

(51) Int. Cl.
*B05C 11/00*    (2006.01)
(52) U.S. Cl. .................. 118/612; 118/667; 118/689
(58) Field of Classification Search .......... 118/429, 118/667, 612, 688–691; 427/437, 438
See application file for complete search history.

(56) References Cited

U.S. PATENT DOCUMENTS

| 2,461,276 | A | * | 2/1949 | Charles | 508/539 |
| 2,941,902 | A | * | 6/1960 | Talmey et al. | 427/345 |
| 3,727,680 | A | * | 4/1973 | Henry, Jr. | 165/119 |
| 5,830,805 | A | | 11/1998 | Shacham-Diamand et al. | |
| 6,065,424 | A | | 5/2000 | Shacham-Diamand et al. | |
| 6,500,482 | B1 | * | 12/2002 | Morcos | 427/8 |
| 6,554,207 | B2 | * | 4/2003 | Ebberts | 239/146 |
| 6,638,564 | B2 | * | 10/2003 | Segawa et al. | 427/8 |
| 6,843,852 | B2 | * | 1/2005 | Dubin et al. | 118/50 |
| 2003/0134047 | A1 | * | 7/2003 | Dubin et al. | 427/421 |
| 2004/0045502 | A1 | * | 3/2004 | Yokoyama et al. | 118/429 |

* cited by examiner

*Primary Examiner*—Brenda A Lamb
(74) *Attorney, Agent, or Firm*—Schwabe, Williamson & Wyatt, P.C.

(57) ABSTRACT

Electroless plating systems and methods are described herein.

6 Claims, 6 Drawing Sheets

ELECTROLESS PLATING SYSTEMS AND METHODS

TECHNICAL FIELD & BACKGROUND

The present invention is related to the field of integrated circuits (IC). More specifically, various aspects of the present invention are related to electroplating electroless plating of wafers, an operation included in most IC fabrication process. As with virtually all other fabrication operations, deposition, planarization, etching, and so forth, the requirements have to be met with virtually no deviation.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION OF ILLUSTRATIVE EMBODIMENTS

Various aspects of the illustrative embodiments will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

The phrase "in one embodiment" is used repeatedly. The phrase generally does not refer to the same embodiment, however, it may. The terms "comprising", "having" and "including" are synonymous, unless the context dictates otherwise.

Figure 1:
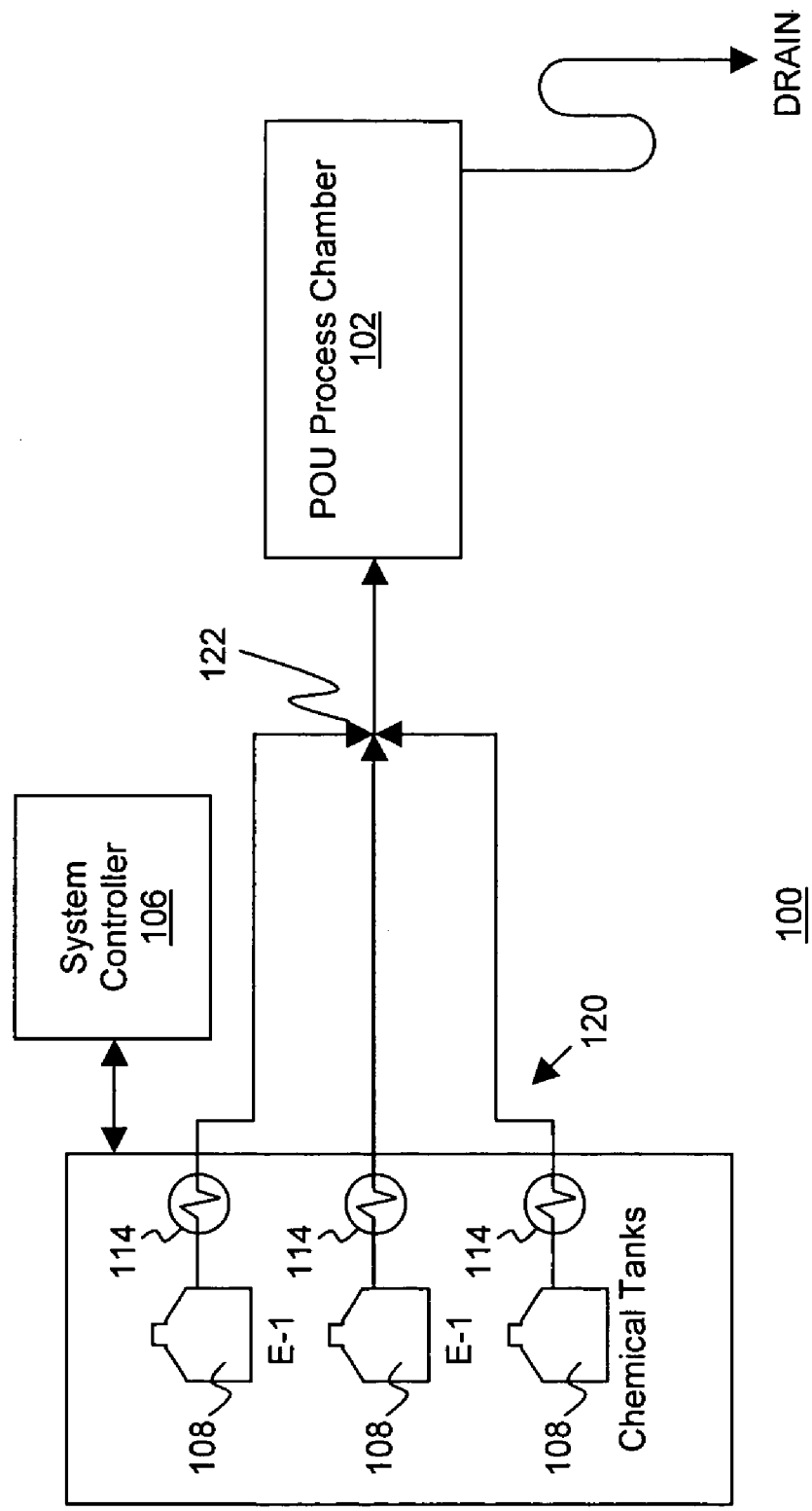
FIG. 1 illustrates an electroless plating system, in accordance with one embodiment of the present invention.

Referring now to FIG. 1, wherein a simplified diagram illustrating an electroless plating system, in accordance with one embodiment, is shown. As illustrated, electroless plating system 100 includes point of use (POU) process chamber 102 (hereinafter, simply chamber) and a number of chemical tanks 108 coupled to each other by a piping system 120 as shown. For the embodiment, piping system 120 includes corresponding in-line heaters 114 for tanks 108. Further, system 100 includes system controller 106 coupled to tanks 108 and in-line heaters 114.

Chamber 102 is employed to apply a plating solution to wafers. In various embodiments, chamber 102 may be a spray type, a microcell type, a spin on type, or other electroless plating chamber of the like.

For the embodiments, the chemicals employed to form the plating solution are separated pre-heated to an application temperature, and mixed in-line at point 122 of piping system 120 which is substantially just prior to the point of application to a wafer (in chamber 102). Resultantly, plating solution is anticipated to be more suitable for plating wafer, e.g. containing less particles.

In various embodiments, the plating solution is formed by mixing a metal with a complexing agent, a buffer, a pH adjuster and/or a reducing agent. In various embodiments, the metal may be one of Co, Cu, Ni, Fe, Ag, Au, Pt, Pd and Ru. The complexing agent may be a selected one of a citric acid and EDTA (Ethylenediamine Tetraacetic Acid). The buffer may be a selected one of $NH_4Cl$ and a boric acid. The pH adjuster is a selected one of KOH and TMAH (Tetramethylammonium Hydroxide). The reducing agent may be one of DMAB (Dimethylaminobenzaldehyde), hypophosphite, formaldehyde, and glyoxylic acid. The exact composition, including the amount of contribution of each constituent chemical is application dependent.

Tanks 108 are employed to separately hold the metal, and the one or more of the complexing agent, the buffer, the pH adjuster and the reducing agent, separately at room temperature. Tanks 108 may be tanks of any type suitable for the particular chemicals.

Corresponding in-line heaters 114 are employed to separately heat the chemicals to an application temperature. The exact temperature is application dependent. In various embodiments, the temperature is in the range of 30 C-90 C.

System controller 106 is employed to control the operation of system 100. In various embodiments, system controller 106 may be a special purpose or general purpose computing device, provided it has the appropriate input/output interfaces for interfacing with the various tanks 108 and heaters 114. These interfaces may be serial or parallel interfaces of a variety of types.

Figure 2:
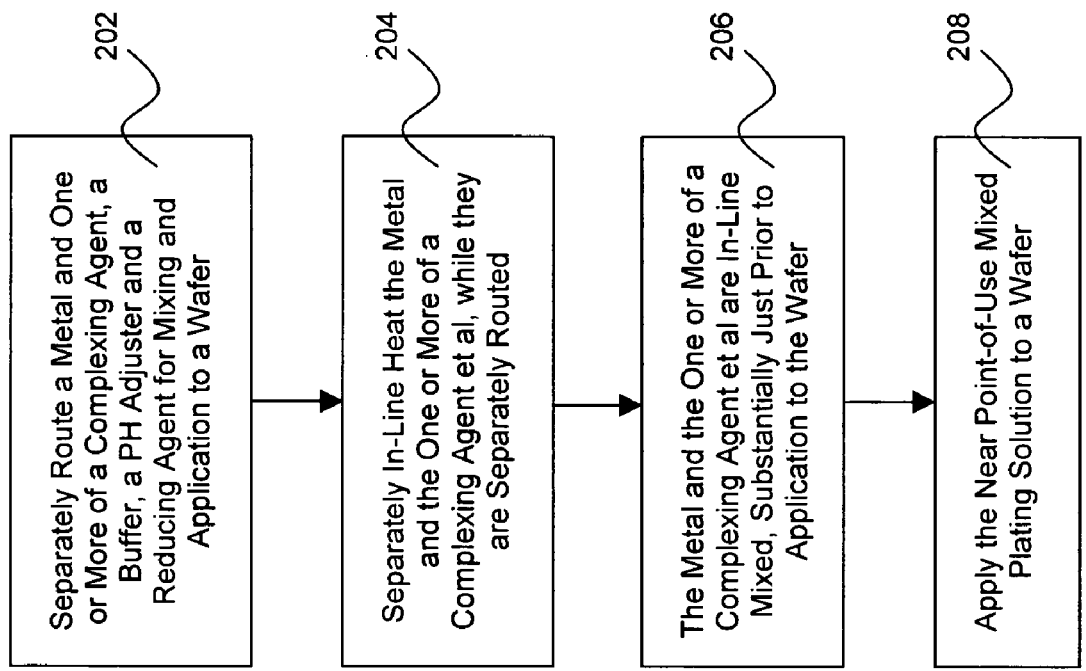
FIG. 2 illustrates an electroless plating method employing the electroless plating system of FIG. 1, in accordance with one embodiment of the present invention.

FIG. 2 illustrates an electroless plating method, employing the electroless plating system of FIG. 1, in accordance with one embodiment. As illustrated, at 202, a metal and one or more of a complexing agent, a buffer, a pH adjuster and a reducing agent are separately routed for mixing and application to a wafer. At 204, the metal and the one or more of a complexing agent, a buffer, a pH adjuster and a reducing agent are separately in-line heated to an application temperature, while they are being separately routed.

Thereafter, at 206, the heated metal and the heated one or more of a complexing agent, a buffer, a pH adjuster and a reducing agent are in-line mixed substantially just prior to application to the wafer. Finally, at 208, the near point-of-use mixed plating solution is applied to the wafer.

Figure 3:
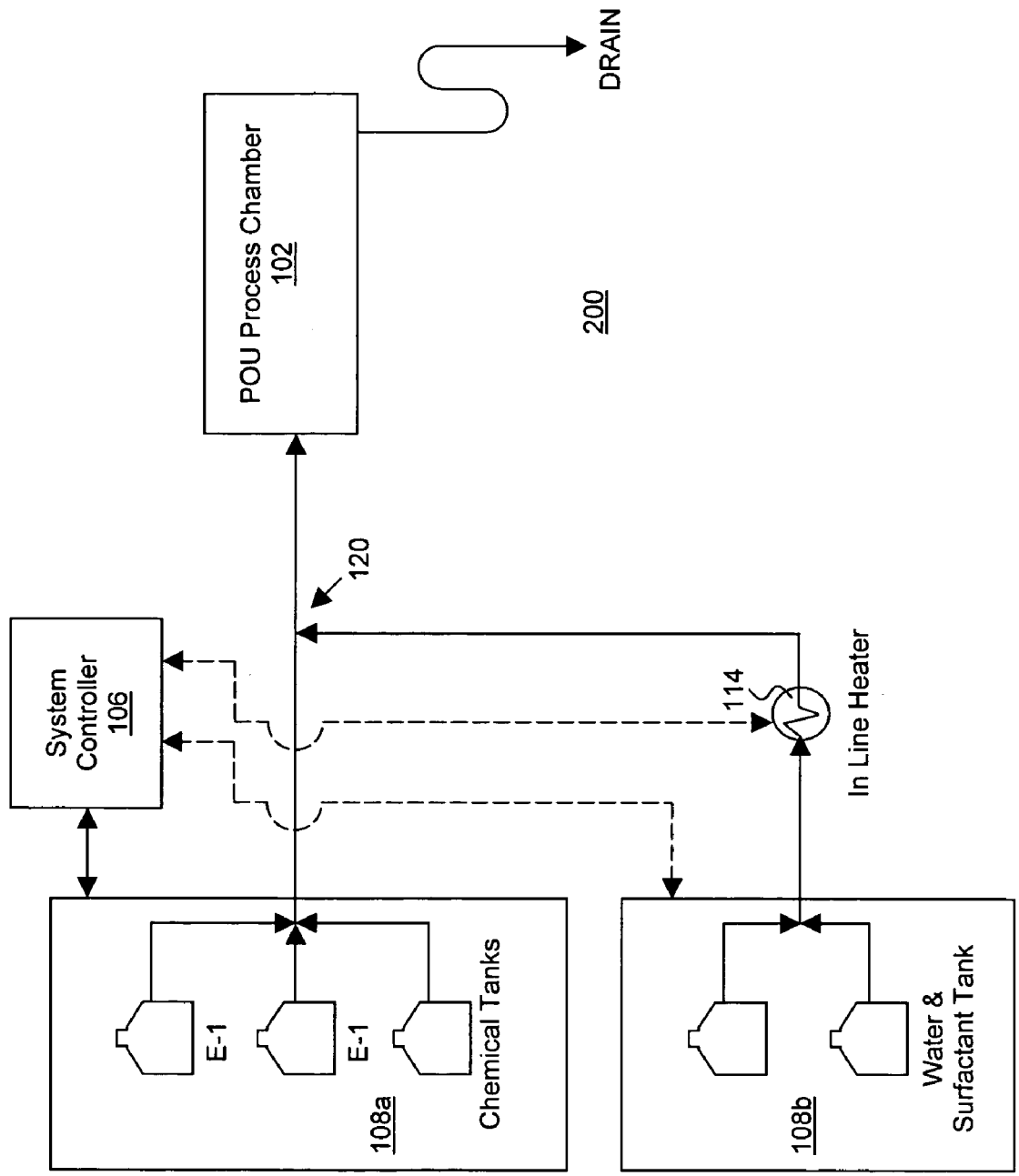
FIG. 3 illustrates another electroless plating system, in accordance with another embodiment of the present invention.

Referring now to FIG. 3, wherein a simplified diagram illustrating another electroless plating system in accordance with another embodiment, is shown. Similar to the embodiment of FIG. 1, electroless plating system 300 includes a point of use (POU) process chamber 102 (hereinafter, simply chamber), a number of chemical tanks 108a, coupled to each other by a piping system 120 as shown. Additionally, electroless plating system 300 includes a number of water and surfactant tanks 108b, coupled to the earlier enumerated elements as shown. Piping system 120 further includes in-line heater 114 for tanks 108b. As the embodiment of FIG. 1, system 100 also includes system controller 106 coupled to tanks 108a-108b and in-line heater 114.

Chamber 102, tanks 108a and system controller 106 are employed for substantially the same purposes, and similarly constituted as earlier described for the embodiment of FIG. 1, except system controller 106 is also employed to control tanks 108b.

Tanks 108b are employed to separately hold de-ionized (DI) water and a surfactant. In various embodiments, the surfactant may be one of RE 610, Triton X100, polyethers, and polyoxyethylne. In alternate embodiments, electroless plating system 300 may be practiced without the use of surfactant.

In-line heaters 114 are employed to heat the mixture of DI water and the surfactant at an application temperature. The exact temperature is application dependent. In various embodiments, the temperature is in the range of 70 C-100 C.

The heated DI water (with or without surfactant) is employed to heat the pipe segments, as well as to dilute and heat the plating solution. Resultantly, under this embodiment, plating solution is also anticipated to be more suitable for plating wafer, e,g. containing less particles.

Figure 4:
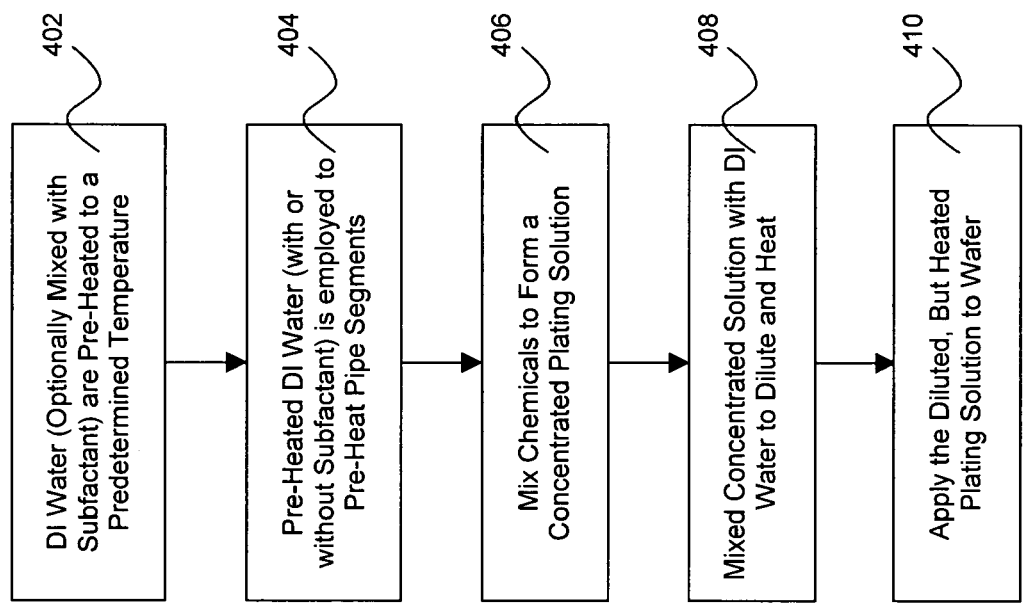
FIG. 4 illustrates another electroless plating method employing the electroless plating system of FIG. 3, in accordance with another embodiment of the present invention.

FIG. 4 illustrates another electroless plating method, employing the electroplating electroless plating system of FIG. 3 in accordance with one embodiment. As illustrated, at 402, DI water (optionally mixed with a surfactant) is preheated to a predetermined temperature. At 404, the pre-heated DI water (with or without surfactant) is employed to pre-heat one or more pipeline segments of pipeline system 120, chamber 102 and a wafer.

Then, at 406, the chemicals are mixed into an initial relatively more concentrated plating solution, which in turn at 408, is mixed with the DI water (with or without surfactant) to form the final properly diluted, but heated plating solution. The concentration of the initial plating solution, DI water dilution ratio, and so forth are all application dependent. In various embodiments, 1 to 10 parts of the DI water are mixed with 1 part of the initial more concentrated plating solution.

Finally, at 410, the diluted, but heated plating solution is applied to the wafer.

Figure 5:
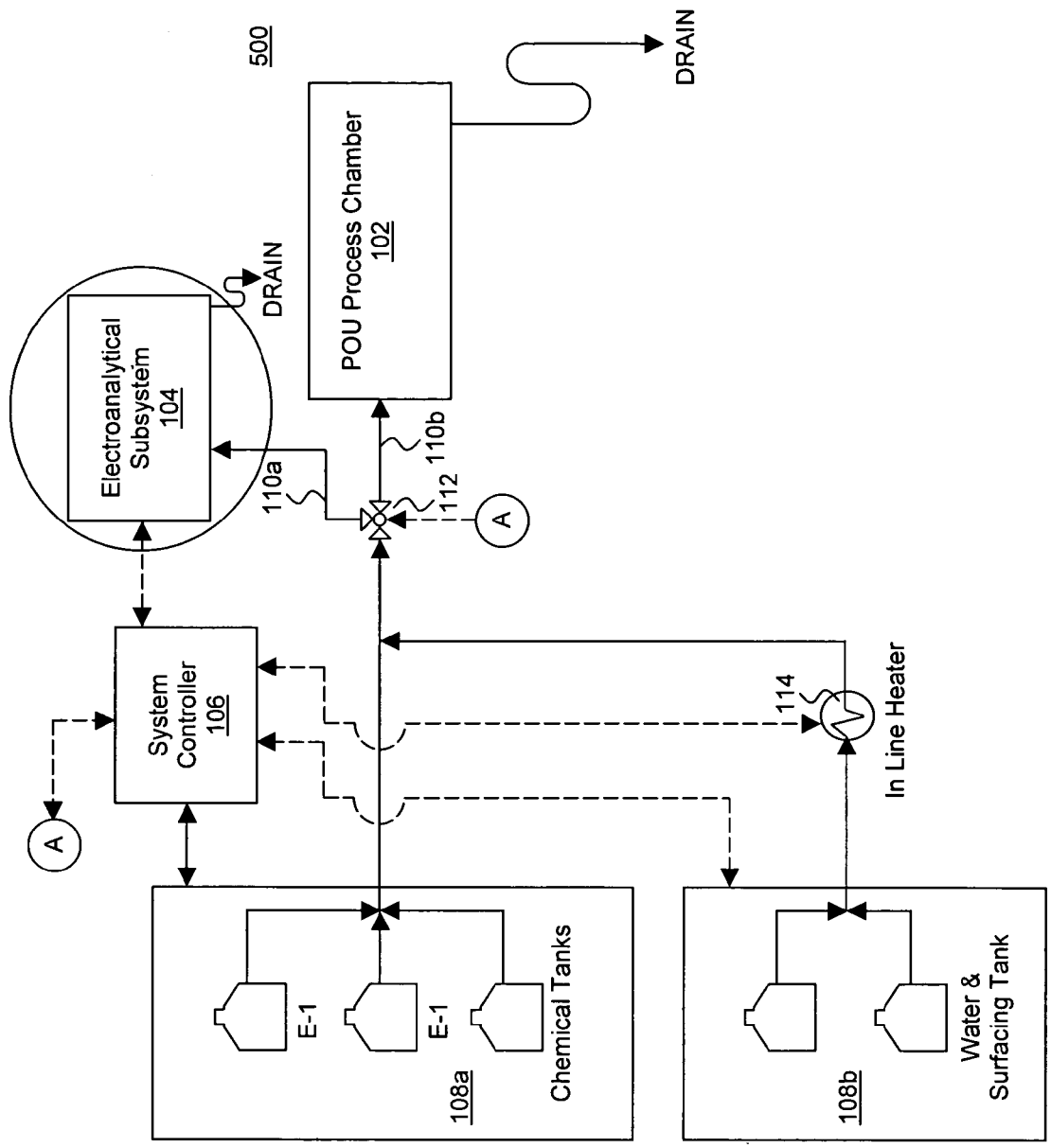
FIG. 5 illustrates yet another electroless plating system, in accordance with yet another embodiment of the present invention.

Referring now to FIG. 5, wherein a simplified diagram illustrating an electroless plating system in accordance with one embodiment is shown. Similar to the embodiment of FIG. 3, electroless plating system 500 includes a point of use (POU) process chamber 102 (hereinafter, simply chamber) and a number of chemical, water and surfactant tanks 108a and 108b, coupled to each other by a piping system as shown. Additionally, electroless plating system 500 includes electroanalytical subsystem 104.

The piping system also includes in particular, configurable valve 112 and first and second routes 110a and 110b coupling chamber 102 and electroanalytical subsystem 104 to valve 112. Further, the piping system includes in-line heaters 114 disposed in between tanks 108b and valve 112, i.e. downstream from tanks 108b, but upstream of valve 112.

Additionally, electroless plating system 100 includes system controller 106, coupled to tanks 118a-118b, electroanalytical system 104, and heaters 114a-114b as shown.

Chamber 102, tanks 108a-108b and system controller 106 are employed for substantially the same purposes, and similarly constituted as earlier described for the embodiment of FIG. 1, except system controller 106 is also employed to cooperate with electroanalytical subsystem 104.

Electroanalytical subsystem 104 is employed to perform a qualification analysis to qualify the final plating solution before allowing the plating solution to be applied to a wafer in chamber 102. In various embodiments, electroanalytical subsystem 104 includes a number of modules to perform one or more electroanalysis of reaction kinetics. In various embodiments, electroanalytical subsystem 104 may include one or more electroanalysis modules for performing electroanalysis for adsorption, nucleation, and deposition rates, pH balances, as well as particles generation count.

More specifically, in various embodiments, electroanalytical subsystem 104 may include a Quart Crystal Mircobalance (QCM) module to analyze the plating solution for adsorption, nucleation, and deposition rates, based e.g. on frequency changes as a function of weight change, an Open Circuit Potential (OCP) module to analyze the plating solution for open circuit potentials, based e.g. on nucleation time, a pH meter to analyze the plating solution for pH balance, a particle counter to analyze the plating solution for particles.

An Ultra Violet Visible Spectroscopy (UV-VIS) to analyze the concentrations of metal ions in the solution Each of these modules may be implemented with any one of a number of these modules available from manufacturers such as, QCM Research of Saddleback Valley of Calif., Radiometer Analytical SAS of Lyon, France, and so forth.

In alternate embodiments, electronanalytical subsystem 104 may be implemented with more or fewer electroanalysis modules.

Valve 112 of the piping system is advantageously employed to selectively route the plating solution, via route 110a, to electroanalytical subsystem 104 for qualification analysis, and via route 110b to chamber 102 for application, after the plating solution has been qualified by the qualification analysis. In various embodiments, valve 112 may be implemented employing any one of a number of valves of the electronic type. In other embodiments, other controllable or configurable valves may also be employed.

For the illustrated embodiment, system controller 106 is further employed to analyze the results of the qualification analyses performed by electroanalytical subsystem 104. In various embodiments, system controller 106 compares the results of the electroanalytical analyses, i.e. QCM, OCP and other measurements, with a number of thresholds/limits. In various embodiments, these thresholds and/or limits are pre-provided to system controller 106. The threshold and/or limits are application dependent, depending on the electroless plating desired for a wafer, and they may be empirically determined.

In various embodiments, system controller 106 stops tanks 108a-108b from further supplying the plating solution, if not all of the thresholds and limits are met. In other embodiments, system controller 106 may be equipped to adjust the chemicals, water and/or surfactant supplied by tanks 108a-108b, and/or the amount of heat supplied by heater 114, if not all of the thresholds and limits are met, but the failing metrics are within certain tolerance levels. Just like the threshold and limits, the tolerance levels are application dependent, and may be empirically determined.

In alternate embodiments, the plating solution to be qualified may be formed employing tanks 108 and corresponding in-line heaters 114, configured as shown in FIG. 3. Regardless, the embodiment provides a high degree of assurance in achieving the desired quality of electroless plating.

Figure 6:
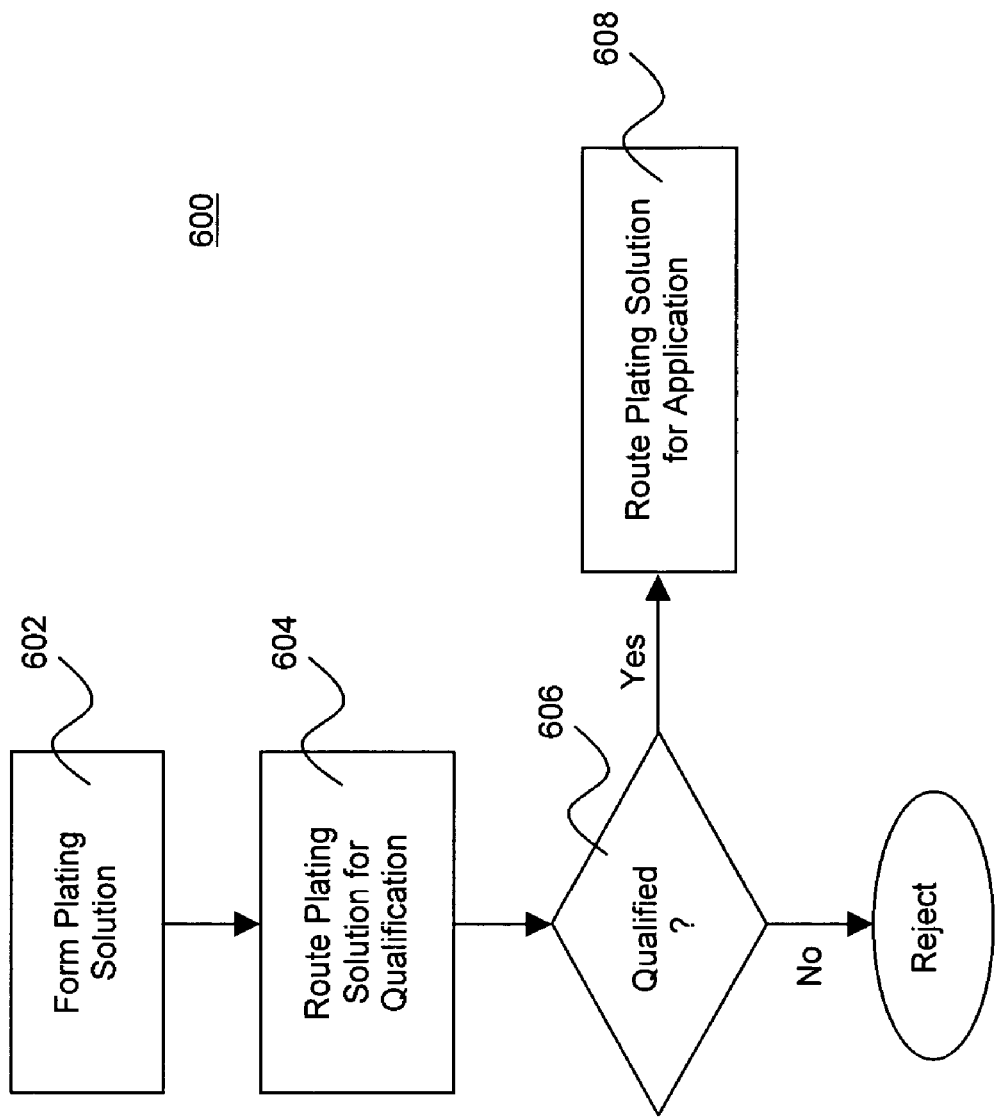
FIG. 6 illustrates yet another electroless plating method employing the electroless plating system of FIG. 5, in accordance with yet another embodiment of the present invention.

FIG. 6 illustrates yet another electroless plating method of the present invention, in accordance with one embodiment. As illustrated, at 602, the plating solution is first formed (e.g. as earlier described referencing FIG. 4). At 604, the plating solution is first routed for qualification analysis. At 606, the results of the qualification analysis are examined to determine if the plating solution passes the qualification analysis. If the determination is affirmative, i.e. the plating solution was determined to pass the qualification analysis, the plating solution is allowed to be routed to the application chamber for application onto wafers, 608. However, if the determination is negative, i.e. the plating solution failed to pass the qualification analysis, the plating solution is rejected, and the electroless plating process is halted for correction.

CONCLUSION AND EPILOGUE

Thus, it can be seen from the above descriptions, a novel electroless plating system and method have been described. While the present invention has been described in terms of the foregoing embodiments, those skilled in the art will recognize that the invention is not limited to the embodiments described. The present invention can be practiced with modification and alteration within the spirit and scope of the appended claims. For example, the chemicals may be delivered in bulk in part or in entirety.

Thus, the description is to be regarded as illustrative instead of restrictive on the present invention.

What is claimed is:

1. A system comprising:
   a point-of-use process chamber including a drain and configured to apply a plating solution to plate one or more wafers by spray, microcell, or spin on;
   a plurality of tanks to separately hold constituent chemicals of the plating solution;
   a piping system having a plurality of segments, including a plurality of in-line heaters for a subset of the segments, to separately route, in-line heat, and after heating, mix, at a mixing point, the constituent chemicals of the plating solution to form the plating solution, substantially just prior to application to the one or more wafers; and
   a system controller configured to receive results of a qualification analysis of the plating solution and control a supply to the mixing point of the constituent chemicals, by interfacing with the plurality of tanks, based on the qualification analysis.

2. The system of claim 1, wherein the plurality of tanks comprise a tank to store a constituent chemical selected from Co, Cu, Ni, Fe, Ag, Au, Pt, Pd and Ru.

3. The system of claim 1, wherein the plurality of tanks comprise a tank to store a constituent chemical from a citric acid complex agent, an EDTA complex agent, a NH4Cl buffer, a boric acid buffer, a KOH pH adjuster, a TMAH pH adjuster, a DMAB reducing agent, a hypophosphite reducing agent, a formaldehyde reducing agent, and a glyoxylic acid reducing agent.

4. The system of claim 1, wherein the in-line heaters are capable of in-line heating the constituent chemicals to an application temperature in a range of 30° C.-90° C.

5. The system of claim 1, wherein the plurality of tanks are configured to separately hold the constituent chemicals at room temperature.

6. The system of claim 1, wherein the system controller is configured to interface with the plurality of in-line heaters.

* * * * *

UNITED STATES PATENT AND TRADEMARK OFFICE
CERTIFICATE OF CORRECTION

PATENT NO. : 7,597,763 B2 Page 1 of 1
APPLICATION NO. : 10/763470
DATED : October 6, 2009
INVENTOR(S) : Dubin et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1627 days.

Signed and Sealed this

Twenty-eighth Day of September, 2010

David J. Kappos
*Director of the United States Patent and Trademark Office*